(12) United States Patent
Beck et al.

(10) Patent No.: US 11,852,705 B2
(45) Date of Patent: Dec. 26, 2023

(54) MR IMAGING USING A 3D RADIAL OR SPIRAL ACQUISITION WITH SOFT MOTION GATING

(71) Applicant: KONINKLIJKE PHILIPS N.V., Eindhoven (NL)

(72) Inventors: Gabriele Beck, Venlo (NL); Chennakeshava Krishna, Bangalore (IN); Suthambhara Nagaraj, Mysore (IN); Johannes Martinus Peeters, Nuenen (NL)

(73) Assignee: Koninklijke Philips N.V., Eindhoven (NL)

(*) Notice: Subject to any disclaimer, the term of this patent is extended or adjusted under 35 U.S.C. 154(b) by 102 days.

(21) Appl. No.: 17/436,678

(22) PCT Filed: Mar. 13, 2020

(86) PCT No.: PCT/EP2020/056907
§ 371 (c)(1),
(2) Date: Sep. 7, 2021

(87) PCT Pub. No.: WO2020/183000
PCT Pub. Date: Sep. 17, 2020

(65) Prior Publication Data
US 2022/0146614 A1 May 12, 2022

(30) Foreign Application Priority Data
Mar. 14, 2019 (EP) .................................. 19162915

(51) Int. Cl.
*G01V 3/00* (2006.01)
*G01R 33/48* (2006.01)
(Continued)

(52) U.S. Cl.
CPC ...... *G01R 33/4826* (2013.01); *G01R 33/5611* (2013.01); *G01R 33/5673* (2013.01); *G01R 33/5676* (2013.01); *G01R 33/56308* (2013.01)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS 8,427,153 B2 4/2013 Hu et al.
8,699,771 B2 4/2014 Wollenweber et al.
(Continued)

FOREIGN PATENT DOCUMENTS

CN 106803865 A * 6/2017
CN 106803865 A 6/2017
(Continued)

OTHER PUBLICATIONS

EP 0413513 A2 PELC (Year: 1991).*
(Continued)

*Primary Examiner* — Walter L Lindsay, Jr.
*Assistant Examiner* — Frederick Wenderoth

(57) ABSTRACT

The invention relates to a method of MR imaging of an object (10). It is an object of the invention to enable MR imaging using a 3D radial or spiral acquisition scheme providing an enhanced image quality in the presence of motion. The method comprises the steps of: —generating MR signals by subjecting the object (10) to an imaging sequence comprising RF pulses and switched magnetic field gradients; —acquiring the MR signals using a 3D radial or spiral acquisition scheme with oversampling of a central portion (26) of k-space; —detecting motion-induced displacements (d) and/or deformations of the object (10) during the acquisition of the MR signals and assigning each of the
(Continued)

acquired MR signals to a motion state; —reconstructing an MR image from the MR signals weighted in the central portion (26) of k-space, wherein a stronger weighting (W, 30) is applied to MR signals acquired in more frequent motion states, while a weaker weighting (W, 31, 32) is applied to MR signals acquired in less frequent motion states. Moreover, the invention relates to a MR device (1) and to a computer program for a MR device (1).

20 Claims, 3 Drawing Sheets

(51) Int. Cl.
  *G01R 33/561* (2006.01)
  *G01R 33/563* (2006.01)
  *G01R 33/567* (2006.01)
(58) Field of Classification Search
  USPC .......................................................... 324/309
  See application file for complete search history.

(56) References Cited

U.S. PATENT DOCUMENTS

| | | | |
|---|---|---|---|
| 9,983,283 | B2 | 5/2018 | Dannels |
| 2005/0054910 | A1 | 3/2005 | Tremblay et al. |
| 2008/0310696 | A1 | 12/2008 | Hwang |
| 2012/0243756 | A1 | 9/2012 | Samsonov et al. |
| 2012/0262172 | A1 | 10/2012 | Holmes et al. |
| 2014/0210469 | A1 | 7/2014 | Cheng et al. |
| 2014/0301622 | A1 | 10/2014 | Forman |
| 2016/0377693 | A1 | 12/2016 | Pednekar et al. |
| 2017/0303860 | A1 | 10/2017 | Lai |
| 2018/0149721 | A1 | 5/2018 | Beck |

FOREIGN PATENT DOCUMENTS

| | | | | |
|---|---|---|---|---|
| CN | 107609460 | A * | 1/2018 | |
| DE | 112013004852 | T5 * | 6/2015 | ............. A61B 5/055 |
| DE | 102015107347 | A1 * | 11/2016 | ......... G01R 33/4824 |
| DE | 102016200293 | A1 * | 7/2017 | ......... G01R 33/5608 |
| EP | 2735880 | A1 * | 5/2014 | ............. G01R 33/32 |
| JP | 2015128252 | | 7/2015 | |
| WO | 2013159044 | A1 | 10/2013 | |

OTHER PUBLICATIONS

M. Lustig et al "Compressed Sensing MRI" IEEE Signal Processing Magazine 2008 vol. 25, No. 2 p. 72-82.

Wu et al "Anisotropic Field of View Support for Golden Angle Radial Imaging" Magn. Reson. Med. 76, p. 229-236 (2016).

Zhou et al "Golden Ratio Rotated Stack of Stars Acquisition for Improved Volumetric MRI" Magn. Reson. Med 2017.

Chaptinel et al "Respiratory Displacement Dependent Weighted of the Center of K-Space for Improved Image Quality in Self-Navigated Golden Angle 3D Radial Whole-Heart Coronary MRA" Proceedings of the International Soc. for Magnetic Reson. in Med. May 10-16, 2014.

Teresa Correia et al "Technical Note: Accelerated Nongrid Motion Compensated Isotropic 3D Coronary MR Angiography" Medical Physics, vol. 45, No. 1 Dec. 12, 2017 p. 214-222.

Li Feng et al "XD-GRASP: Golden Angle Radial MRI with Reconstruction of Extra Motion State Dimensions Using Compressed Sensing" Magnetic Reson. in Med. vol. 75, No. 2 Mar. 25, 2015.

International Search Report and Written Opinion from PCT/EP2020/056907 dated Sep. 17, 2020.

Zhitao Li et al "Highly Accelerated 3D Dynamic Imaging with Varible Density Golden Angle Stack of Stars Sampling" Proceedings of the Int. Soc. for Magnetic Resonance in Med. vol. 21, Apr. 6, 2013.

* cited by examiner

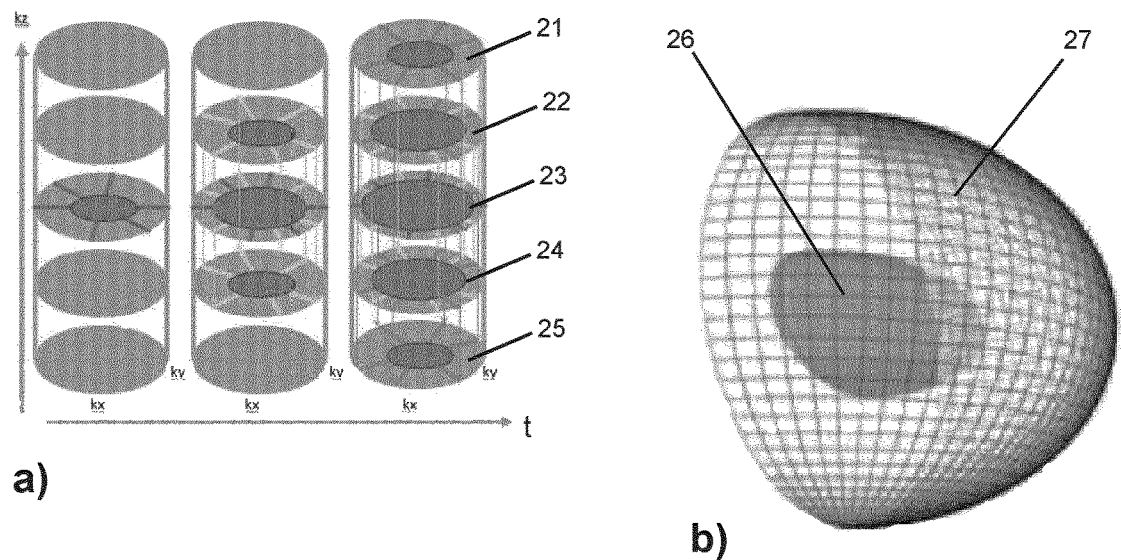
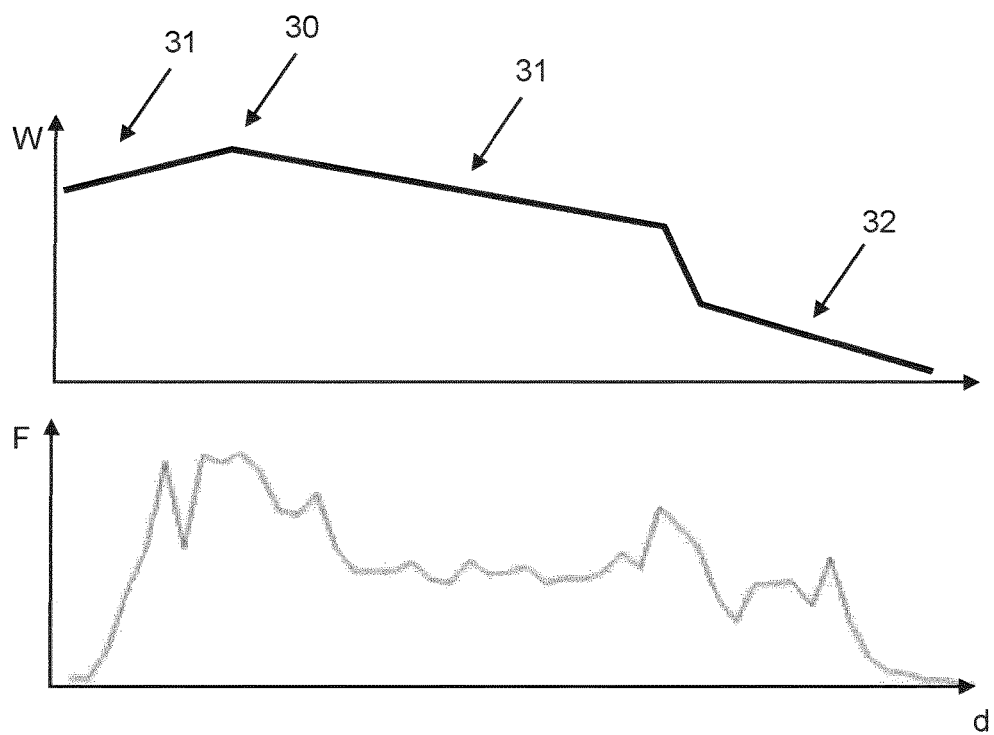
Fig. 3

 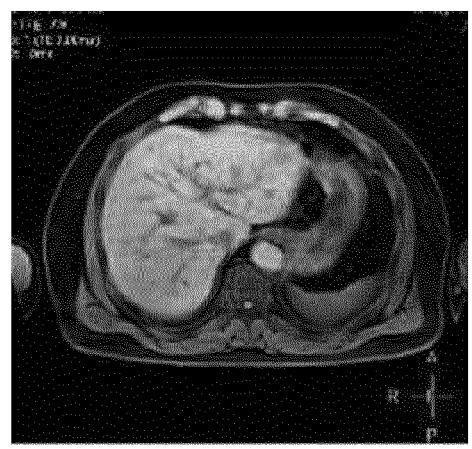
a) b)
Fig. 4

MR IMAGING USING A 3D RADIAL OR SPIRAL ACQUISITION WITH SOFT MOTION GATING

CROSS REFERENCE TO RELATED APPLICATIONS

This application is a U.S. national phase application of International Application No. PCT/EP2020/056907 filed on Mar. 13, 2020, which claims the benefit of EP Application Serial No. 19162915.3 file Mar. 14, 2019 and is incorporated herein by reference.

FIELD OF THE INVENTION

The invention relates to the field of magnetic resonance (MR) imaging. It concerns a method of MR imaging of an object placed in the examination volume of a MR device. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field $B_0$ whose direction at the same time defines an axis (normally the z-axis) of the co-ordinate system to which the measurement is related. The magnetic field $B_0$ produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) while the corresponding magnetic field $B_1$ of this RF pulse extends perpendicular to the z-axis, so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the magnetization is deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second and shorter time constant $T_2$ (spin-spin or transverse relaxation time). The transverse magnetization and its variation can be detected by means of receiving RF coils which are arranged and oriented within an examination volume of the MR device in such a manner that the variation of the magnetization is measured in the direction perpendicular to the z-axis. The decay of the transverse magnetization is accompanied by dephasing taking place after RF excitation caused by local magnetic field inhomogeneities facilitating a transition from an ordered state with the same signal phase to a state in which all phase angles are uniformly distributed. The dephasing can be compensated by means of a refocusing RF pulse (for example a 180° pulse). This produces an echo signal (spin echo) in the receiving coils.

In order to realize spatial resolution in the body, time-varying magnetic field gradients extending along the three main axes are superposed on the uniform magnetic field $B_0$, leading to a linear spatial dependency of the spin resonance frequency. The signal picked up in the receiving coils then contains components of different frequencies which can be associated with different locations in the body. The signal data obtained via the receiving coils correspond to the spatial frequency domain and are called k-space data. The k-space data usually include multiple lines acquired of different phase encoding. Each line is digitized by collecting a number of samples. A set of k-space data is converted to an MR image by means of Fourier transformation.

In the known so-called three-dimensional (3D) stack-of-stars acquisition scheme (see, e.g., WO 2013/159044 A1), a number of spatially non-selective or slab-selective RF excitations is applied, each followed by the acquisition of one or more MR signals (e.g. gradient echo signals), wherein each MR signal represents a k-space profile. The MR signals are acquired as radial k-space profiles from a number of parallel slices. The slices are arranged at different positions along a slice direction in k-space. In the slice direction (e.g. the $k_z$-direction) standard Cartesian phase-encoding is performed, while the MR signals are acquired within each single slice along radial 'spokes' that are rotated around the center ($k_x = k_y = 0$). This results in a cylindrical k-space coverage composed of stacked discs ('stack-of-stars'). Technically, this is realized by generating magnetic field gradients in the in-plane directions of the slices simultaneously and modulating their amplitudes. Different schemes can be used for selecting the temporal order of the k-space profile acquisition steps. E.g., all phase-encoding steps along the slice direction can be acquired sequentially before k-space profiles at different angular positions (rotation angles) are acquired. This ensures that periods of Cartesian sampling are kept short, which leads to high data consistency within the stack of slices and preserves the general motion-robustness of radial sampling for the stack-of-stars approach. The Cartesian phase-encoding steps may be performed from the center slice to the k-space periphery (centric out), or in linear order from $-k_{z,max}$ to $+k_{z,max}$. For the angular ordering, the imaging sequence can use either equidistant angular sampling with multiple interleaves or the so-called golden angle-scheme. In the equidistant scheme, the angular distance, i.e. the increment of the rotation angle of the radial k-space profiles is calculated according to $\Delta\Phi = 180°/n_{total}$ where n is the total number of spokes. It may be beneficial total to acquire the spokes using multiple interleaves (or 'rotations') because the interleaving reduces temporal coherences in k-space. Thus, motion inconsistencies are spread out in k-space and artifacts are attenuated. In the golden angle-scheme, the rotation angle of the k-space profiles is incremented each time by $\Delta\Phi = 111.25°$, which corresponds to 180° multiplied by the golden ratio. Therefore, subsequently sampled spokes always add complementary information while filling the largest gaps within the previously sampled set of spokes. As a consequence, any sequential set of acquired spokes covers k-space approximately uniformly, which, e.g., enables reconstruction of temporal sub-frames and makes the golden-angle scheme well-suited for dynamic (4D) imaging studies.

Similarly, in the also known stack-of-spirals acquisition scheme, each non-selective or slab-selective RF excitation is followed by the acquisition of one or more MR signals that represent spiral k-space profiles. Like in the stack-of-stars method, the slices are also arranged at different positions along a slice direction in k-space, wherein standard Cartesian phase-encoding is performed in the slice direction, while the MR signals are acquired within each single slice along spiral trajectories having their origin in the k-space center ($k_x=k_y=0$).

The afore-described 3D radial stack-of-stars and stack-of-spirals schemes offer several promising advantages for clinical 3D and 4D MR imaging like high motion-robustness and benign aliasing artifacts, in particular in combination with a golden angle distribution of k-space profiles.

However, although this intrinsic motion-robustness, the acquired MR images may still be compromised by motion-induced signal fluctuations as long as no additional measures for motion compensation are applied.

Motion compensation approaches for stack-of-stars imaging are known in the art.

For example, gating techniques have been developed accepting only MR signal data acquired within a certain predefined respiratory gating window. To cope with potential drift problems, a multi-gating window approach (referred to as PAWS, see U.S. Pat. No. 7,039,451 B1) has been proposed using a number of individual motion states (bins) rather than one pre-defined gating window. Each of the motion states corresponds to one of a plurality of contiguous ranges of motion-induced displacements of the body under examination. The final MR image in PAWS is reconstructed from the MR signal data attributed the motion state for which a complete set of MR signal samples is acquired first.

SUMMARY OF THE INVENTION

From the foregoing it is readily appreciated that there is a need for an improved motion compensation in 3D or 4D radial or spiral MR imaging techniques. It is consequently an object of the invention to enable MR imaging using a 3D radial or spiral acquisition scheme providing an enhanced image quality in the presence of motion.

In accordance with the invention, a method of MR imaging of an object placed in the examination volume of a MR device is disclosed. The method comprises the steps of: —
  generating MR signals by subjecting the object to an imaging sequence comprising RF pulses and switched magnetic field gradients;
  acquiring the MR signals using a 3D radial or spiral acquisition scheme with oversampling of a central portion of k-space;
  detecting motion-induced displacements and/or deformations of the object during the acquisition of the MR signals and assigning each of the acquired MR signals to a motion state;
  reconstructing an MR image from the MR signals weighted in the central portion of k-space, wherein a stronger weighting is applied to MR signals acquired in more frequent motion states, while a weaker weighting is applied to MR signals acquired in less frequent motion states.

According to the invention, a three-dimensional radial or spiral acquisition (preferably a stack-of-stars or stack-of-spirals acquisition) is performed with oversampling of the central portion of k-space. The radial or spiral k-space sampling density is higher at k-space locations closer to the k-space center (k=0), while the sampling density is lower in slices that are located more remotely from the k-space center. Due to the oversampling, the sampling density is higher than required by the Nyquist criterion in the central portion of k-space. The increased density of k-space sampling near the k-space center already results in a reduced level of streaking artifacts while the total scan time can be kept at a minimum. According to the invention, the oversampling of the central k-space portion enables weighting of the MR signals in central k-space for the purpose of yet further reducing motion artifacts. Notably, this may be achieved by relative stronger weighting of the MR signals in central k-space as compared to weighting of the MR signals in peripheral k-space It is the gist of the invention to detect motion of the examined object (the patient), for example by external motion sensors (respiratory belt, camera etc.) or by intrinsic motion detection based, e.g., on the correlation of the k-space profiles acquired in temporal sequence. Displacements and/or deformations of the object are determined in this way during the acquisition of the MR signals such that each of the acquired MR signals can be assigned to a motion state. Each of the motion states may preferably be defined to correspond to one of a plurality of contiguous ranges of motion-induced displacements and/or deformations of the object. Motion detection may also be done on the basis of an elastic registration of low-resolution images reconstructed from MR-data from the centre oversampled region of k-space. The invention suggests a 3D soft gating approach by weighting the MR signals in the oversampled central portion of k-space, wherein a stronger weighting is applied to MR signals acquired in more frequent motion states, while a weaker weighting is applied to MR signals acquired in less frequent motion states. In this way, MR signals acquired in a more common motion state of the examined object contribute more to the reconstructed MR images while MR signals assigned to further distant motion outliers have a weaker contribution. In other words, MR signals acquired with the examined object assuming its most frequently taken positions are given a stronger weight while MR signals acquired from the object in rarely assumed positions are suppressed in the reconstructed MR image. Preferably, the applied weighting factor varies smoothly as a function of the detected displacement/deformation ("soft gating"). The result of this approach is an MR image reconstructed from a 3D radial or spiral acquisition having a significantly reduced level of artifacts in the presence of motion of the examined object.

In a practical embodiment, the frequency of the occurrence of each motion state as a basis for MR signal weighting in the reconstruction step is derived from a histogram which is set up during or after MR signal acquisition and which reflects the number of acquired MR signals per motion state. Weighting factors for the reconstruction can readily be derived from the histogram, wherein a user-specified gating percentage is taken into account. The gating percentage defines the proportion of the MR signals suppressed by the weighting as a global parameter that can be tuned by the user according to the needs. When determining the weighting factors, the compliance with the Nyquist criterion must be taken into account for the central portion of k-space in order to avoid aliasing artifacts. This may be achieved in that a variable oversampling rate is derived from the user-specified gating percentage.

In a preferred embodiment, a more weighting, i.e. a broader range of weighting factors is applied to the MR signals in the central portion of k-space as compared to the peripheral portion of k-space. The less pronounced weighting in the peripheral k-space has the effect that streaking artifacts from k-space sub-sampling can be avoided.

According to another preferred embodiment, the invention is applied in combination with parallel imaging. The MR signals are acquired in parallel via a number of RF receiving coils having different spatial sensitivity profiles. The MR image is correspondingly reconstructed using a parallel image reconstruction algorithm, like (non-Cartesian) SENSE. The invention may also be combined with compressed sensing (see M. Lustig et al., "Compressed sensing MM", IEEE signal processing magazine, 2008, vol. 25, no. 2, pages 72-82). More pronounced weighting can be applied to the MR signals in the peripheral k-space portions according to the invention if it is combined with SENSE or compressed sensing. These sparsely sampled implementations of the invention may be implemented by way of artificial intelligence techniques. Streaking artifacts can be avoided even if a significant portion of the acquired MR signals assigned to less frequent motion states of the examined object is suppressed.

According to yet another preferred embodiment, a temporal sequence of MR images is reconstructed from the acquired MR signals. In 4D dynamic radial scans, the proposed soft gating approach of the invention can be applied per time frame, i.e. per dynamic scan. The advantage is not only providing improved image quality as, e.g., compared to Navigator gating techniques, within the same scan time, but the approach of the invention also enables equidistant dynamic scan times not influenced, e.g., by the breathing pattern of the examined patient. Further, this 4D aspect may include use of a profile sharing principle, a 3D high pass filter (KWIC) with the weighting principle to derive the temporal information. The histogram and weighting may typically change per dynamic. The weighting may constant in a central plateau. which is effective for 4D scanning to reduce dynamic flickering effects.

To optimize the k-space distribution of the acquired MR signals, the angular ordering of the radial or spiral k-space profiles may be chosen according to a golden angle-scheme. In the golden angle-scheme, as mentioned above, the rotation angle of the k-space profiles is incremented each time by $\Delta\Phi=111.25°$ from acquisition to acquisition, which corresponds to 180° multiplied by the golden ratio. Therefore, subsequently sampled radial or spiral k-space profiles always add complementary information while filling the largest gaps within the previously sampled set of profiles. As a consequence, any sequential set of acquired profiles covers k-space approximately uniformly.

The distribution of rotation angles can be also adapted to anisotropic field of views (see Wu et al. A1, "Anisotropic field-of-view support for golden angle radial imaging, Magn Reson Med., 76, 229-236, 2016), wherein the radial (or spiral) k-space profiles are not equidistantly distributed. Other methods for optimizing the sampling order like, e.g., CENTRA ordering (see WO 2016202707 A1) or Rotated Stack-of-Stars (see Zhou et al., "Golden-ratio rotated stack-of-stars acquisition for improved volumetric MRI", Magn. Reson. Med. 2017) can be combined with the method of the invention.

The method of the invention described thus far can be carried out by means of a MR device including at least one main magnet coil for generating a uniform, steady magnetic field $B_0$ within an examination volume, a number of gradient coils for generating switched magnetic field gradients in different spatial directions within the examination volume, at least one body RF coil for generating RF pulses within the examination volume and/or for receiving MR signals from a body of a patient positioned in the examination volume, a control unit for controlling the temporal succession of RF pulses and switched magnetic field gradients, and a reconstruction unit for reconstructing MR images from the received MR signals. The method of the invention can be implemented by a corresponding programming of the reconstruction unit and/or the control unit of the MR device.

The method of the invention can be advantageously carried out on most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings:

FIG. 2 shows a diagram of k-space schematically illustrating an embodiment of the k-space sampling scheme of the invention;

FIG. 3 illustrates the determination of the weighting factors applied in the soft motion gating scheme of the invention;

FIG. 4 shows two MR images, FIG. 4a shows an MR image conventionally acquired by a 3D radial scan, FIG. 4b shows the same MR image acquired and reconstructed according to the invention.

DETAILED DESCRIPTION OF THE EMBODIMENTS

Figure 1:
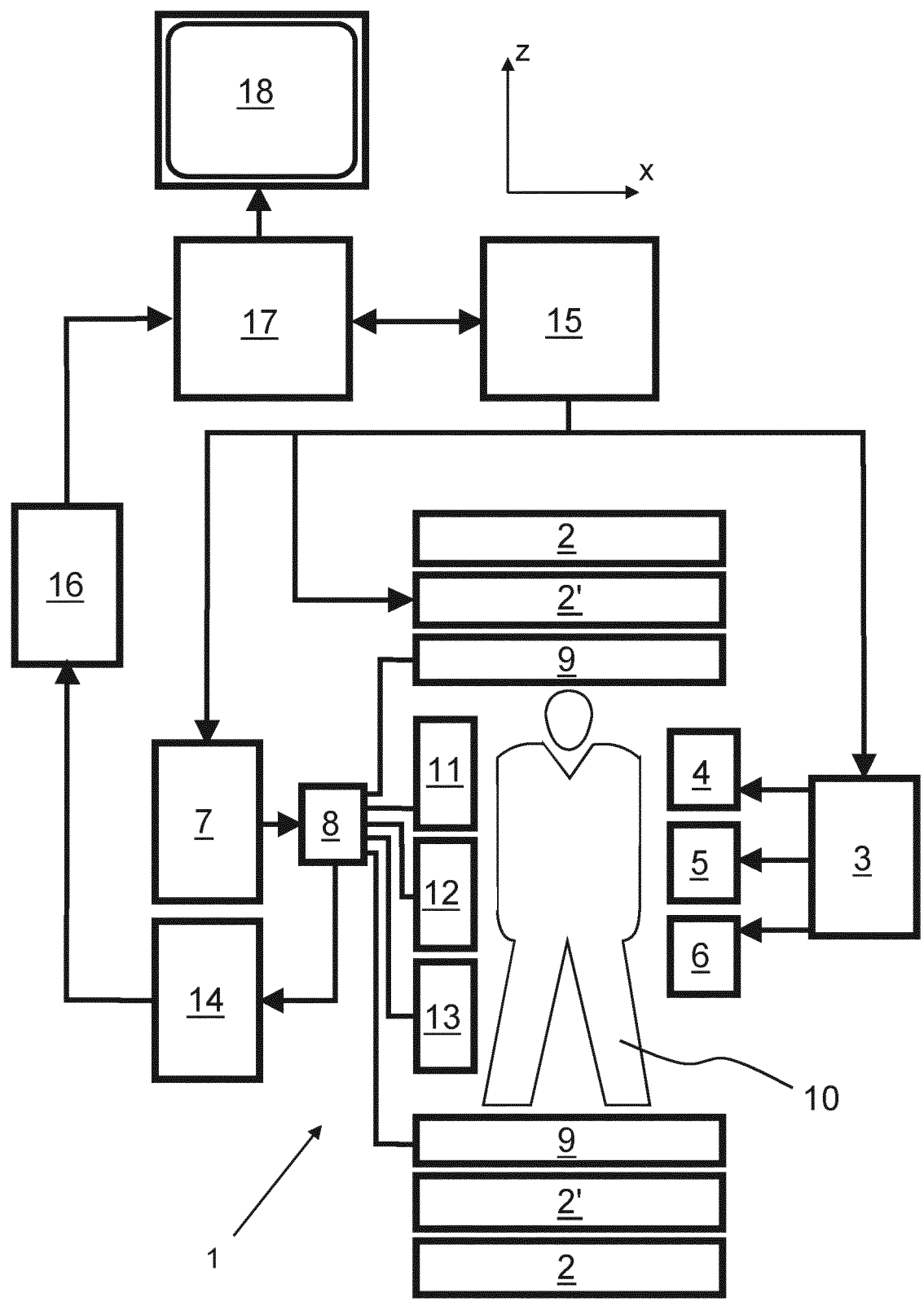
FIG. 1 shows a block diagram of a MR device for carrying out the method of the invention.

With reference to FIG. 1, a MR device 1 is shown as a block diagram. The device comprises superconducting or resistive main magnet coils 2 such that a substantially uniform, temporally constant main magnetic field $B_0$ is created along a z-axis through an examination volume. The device further comprises a set of ($1^{st}$, $2^{nd}$, and—where applicable—$3^{rd}$ order) shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient amplifier 3 applies current pulses or waveforms to selected ones of whole-body gradient coils 4, 5 and 6 along x, y and z-axes of the examination volume. A digital RF frequency transmitter 7 transmits RF pulses or pulse packets, via a send/receive switch 8, to a body RF coil 9 to transmit RF pulses into the examination volume. A typical MR imaging sequence is composed of a packet of RF pulse segments of short duration which, together with any applied magnetic field gradients, achieve a selected manipulation of nuclear magnetic resonance signals. The RF pulses are used to saturate, excite resonance, invert magnetization, refocus resonance, or manipulate resonance and select a portion of a body 10 positioned in the examination volume. The MR signals are also picked up by the body RF coil 9.

For generation of MR images of limited regions of the body 10 or for scan acceleration by means of parallel imaging, a set of local array RF coils 11, 12, 13 are placed contiguous to the region selected for imaging. The array coils 11, 12, 13 can be used to receive MR signals induced by body-coil RF transmissions.

The resultant MR signals are picked up by the body RF coil 9 and/or by the array RF coils 11, 12, 13 and demodulated by a receiver 14 preferably including a preamplifier (not shown). The receiver 14 is connected to the RF coils 9, 11, 12 and 13 via send/receive switch 8.

A host computer 15 controls the shimming coils 2' as well as the gradient pulse amplifier 3 and the transmitter 7 to generate any of a plurality of MR imaging sequences, such as a turbo field echo (TFE) or turbo spin echo (TSE) sequence for 3D radial or spiral imaging. For the selected sequence, the receiver 14 receives a single or a plurality of MR signal profiles in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data are reconstructed into an image representation by a reconstruction processor 17 which applies a Fourier transform or other appropriate reconstruction algorithms, such as SENSE. The MR image represents a three-dimensional volume. The image is then stored in an image memory where it may be accessed for converting slices, projections, or other portions of the image representation into appropriate format for visualization, for example via a video monitor 18 which provides a man-readable display of the resultant MR image.

The host computer 15 is programmed to execute the method of the invention described herein above and in the following.

As shown in FIG. 2a, MR signals are acquired (for example using a conventional TFE imaging sequence) according to a 3D stack-of-stars acquisition scheme. After each of a number of spatially non-selective or slab-selective RF excitations, one or more MR signals are acquired wherein each MR signal represents a k-space profile. The MR signals are acquired as radial k-space profiles from a number (five in the embodiment of FIG. 2a) of parallel slices 21, 22, 23, 24, 25. The slices are arranged at different positions along slice direction $k_z$. In the $k_z$-direction Cartesian phase-encoding is performed, while the MR signals are acquired within each single slice along radial "spokes" that are rotated around the center ($k_x=k_y=0$). This results in a cylindrical k-space coverage composed of stacked discs. For the angular ordering of the spokes a golden angle-scheme is employed. The angle of the spokes is incremented each time by $\Delta\Phi=111.25°$. The radial density of the k-space profiles, i.e. the number of acquired spokes per slice varies as a function of the slice position, wherein the radial density is higher at more central k-space positions and lower at more peripheral k-space positions. This is achieved in the embodiment of FIG. 2a as follows: In a first step, a number of spokes are acquired only from the central k-space slice. In the next step, the same number of spokes is acquired from the central three slices, in the third step, again the same number of spokes is acquired from all five slices. Successive acquisition of the phase-encoding steps along the slice direction is performed before sampling k-space profiles at different golden angular positions which is essential to ensure high data consistency and general motion-robustness. In this way, k-space center (around $k_z=0$) is sampled more densely than the k-space periphery. The radial density of the k-space profiles (the spokes) is varied in this fashion such that the Nyquist criterion according to the given FOV is fulfilled within an ellipsoid 26 (see FIG. 2b) around the center of k-space ($k_x=k_y=k_z=0$). The invention minimizes the overall scan time with k-space sampling conforming to the Nyquist criterion in the central portion 26 of k-space. According to the invention, oversampling is provided in the image energy-dominating central portion 26 of k-space. The radial sampling density gradually decreases from the central slices 22, 23, 24 to the lower radial sampling density in the peripheral slices 21, 25. Outside the ellipsoid 26, i.e. in the peripheral portion 27 of k-space, the radial k-space density may even be below the Nyquist threshold without a significant impact on image quality. The stack-of-stars acquisition scheme may be implemented in practice as a 3D CENTRA radial stack of stars or a 3D elliptical variable density radial stack of stars. Due to the higher radial sampling density around the k-space center, streaking artifacts are already reduced by the described k-space sampling scheme within minimal scan time.

According to the invention, motion of the examined body 10 is detected, for example by a conventional respiratory belt. Displacements of the examined anatomy are determined in this way during the acquisition of the MR signals such that each of the acquired MR signals can be assigned to a motion (breathing) state. Each of the motion states is defined to correspond to one of a plurality of contiguous ranges of the breathing motion-induced displacements.

On this basis, a 3D soft gating approach is implemented by weighting the MR signals in the oversampled central portion 26 of k-space, wherein a stronger weighting is applied to MR signals acquired in more frequent motion states, while a weaker weighting is applied to MR signals acquired in less frequent motion states. MR signals acquired with the patient assuming his most frequently taken positions during breathing are given a stronger weight while MR signals acquired in rarely assumed positions are suppressed in the reconstructed MR image.

The frequency of the occurrence of each motion state as a basis for the MR signal weighting is derived from a histogram as illustrated in the lower diagram of FIG. 3. The histogram is set up during or after MR signal acquisition. It reflects the number of acquired MR signals per motion state. In the diagram, the frequency F is depicted as a function of the detected displacement d assigned to the respective motion state. The weighting factors W shown in the upper diagram of FIG. 3 are derived from the histogram, wherein a user-specified gating percentage is taken into account. The gating percentage defines the proportion of the MR signals suppressed by the weighting as a global parameter that can be tuned by the user according to the needs (wherein image noise and artifact level are counterbalanced). When determining the weighting factors, the compliance with the Nyquist criterion should be taken into account for the central portion 27 of k-space in order to avoid aliasing artifacts. As can be seen in the upper diagram of FIG. 3, a maximum weighting (arrow 30) is applied for the most frequently occurring displacement d. The weighting W drops towards less frequently occurring displacements (arrows 31). A minimum weighting is applied to MR signals attributed to rare outliers of the displacement d (arrow 32). The weighting factor W varies smoothly as a function of the detected displacement d. In the depicted embodiment, the weighting factor is a linear function of the displacement d with different slopes assigned to different ranges of the displacement d. Any other shape of the curve W(d) is of course possible.

The result of this soft gating approach is an MR image reconstructed from a 3D radial or spiral acquisition having a significantly reduced level of artifacts in the presence of motion of the body 10 of the patient. This can be seen in FIG. 4 showing a slice MR image acquired from the thorax region using a 3D radial acquisition method. The MR image shown in FIG. 4a has been acquired and reconstructed conventionally, while the MR image of FIG. 4b has been reconstructed using the soft gating approach of the invention. The MR image of FIG. 4a shows significant motion artifacts (white arrow indicating streaking artifacts). These artifacts are not present in the MR image of FIG. 4b.

The invention claimed is:

1. A method, comprising:
   a magnetic resonance (MR) imaging device generating MR signals by subjecting object within an examination volume of the MR imaging device to an imaging sequence comprising RF pulses and switched magnetic field gradients;
   the MR imaging device acquiring the MR signals using a 3D radial or spiral acquisition scheme with oversampling of a central portion of k-space;
   detecting motion-induced displacements and/or deformations of the object during the acquisition of the MR signals and assigning each of the acquired MR signals to an assigned motion state among a plurality of motion states; and
   reconstructing an MR image from the MR signals weighted in the central portion of k-space, wherein a stronger weighting is applied to MR signals acquired in more frequent motion states, while a weaker weighting is applied to MR signals acquired in less frequent motion states.

2. A magnetic resonance (MR) imaging device, comprising:
   at least one main magnet coil for generating a uniform, steady magnetic field within an examination volume of the MR imaging device,
   a plurality of gradient coils for generating switched magnetic field gradients in different spatial directions within the examination volume;
   at least one radio frequency (RF) coil for generating RF pulses within the examination volume and/or for receiving MR signals from an object positioned in the examination volume;
   a control unit for controlling the temporal succession of RF pulses and switched magnetic field gradients; and
   a reconstruction unit for reconstructing MR images from the received MR signals;
   wherein the MR device is configured to perform a method comprising:
      generating MR signals by subjecting the object to an imaging sequence comprising RF pulses and switched magnetic field gradients,
      acquiring the MR signals using a 3D radial or spiral acquisition scheme with oversampling of a central portion of k-space,
      detecting motion-induced displacements and/or deformations of the object during the acquisition of the MR signals and assigning each of the MR signals to an assigned motion state among a plurality of motion states, and
      reconstructing an MR image from the MR signals weighted in the central portion of k-space, wherein a stronger weighting is applied to MR signals acquired in more frequent motion states, while a weaker weighting is applied to MR signals acquired in less frequent motion states.

3. A computer program to be run on a magnetic resonance (MR) imaging device, which computer program comprises instructions stored on a non-transitory computer readable medium for:
   generating an imaging sequence comprising radio frequency (RF) pulses and switched magnetic field gradients;
   acquiring MR signals using a 3D radial or spiral acquisition scheme with oversampling of a central portion of k-space;
   detecting motion-induced displacements and/or deformations from an object during the acquisition of the MR signals and assigning each of the MR signals to a motion state; and
   reconstructing an MR image from the MR signals weighted in the central portion of k-space, wherein a stronger weighting is applied to MR signals acquired in more frequent motion states, while a weaker weighting is applied to MR signals acquired in less frequent motion states.

4. The method of claim 1, wherein the frequency of the occurrence of each motion state is determined based on a histogram which reflects the number of acquired MR signals per motion state.

5. The method of claim 1, wherein a broader range of weighted factors is applied to the MR signals in the central portion of k-space, while less pronounced weighting is applied to the MR signals in the peripheral portion of k-space.

6. The method of claim 1, wherein the weighting applied to the MR signals during reconstruction of the MR image is derived from a user-specified gating percentage.

7. The method of claim 1, wherein the MR signals are acquired in parallel via a plurality of radio frequency (RF) receiving coils having different spatial sensitivity profiles.

8. The method of claim 1, wherein the MR image is reconstructed using compressed sensing or a parallel image reconstruction algorithm.

9. The method of claim 1, wherein a temporal sequence of MR images is reconstructed from the acquired MR signals.

10. The method of claim 1, wherein the MR signals are acquired as radial or spiral k-space profiles, wherein the rotation angle of the k-space profiles is incremented according to a golden angle scheme during the acquisition of successive k-space profiles.

11. The method of claim 1, wherein the weighting of the MR signals in the central portion of k-space is adapted per time frame.

12. The method of claim 1, wherein the 3D radial or spiral acquisition scheme includes a radial sampling density that in k-space gradually decreases from the central slices to the lower radial sampling density in the peripheral slices.

13. The method of claim 1, wherein the MR image is reconstructed using a sensitivity encoding (SENSE) algorithm.

14. The method of claim 1, wherein the motion-induced displacements are breathing motion-induced displacements, and wherein each of the motion states is defined to correspond to one of a plurality of contiguous ranges of the breathing motion-induced displacements.

15. The method of claim 1, wherein the object is a patient, and wherein MR signals acquired with the patient assuming their most frequently taken positions during breathing are given a stronger weight while MR signals acquired in rarely assumed positions are suppressed in the reconstructed MR image.

16. The MR imaging device of claim 2, wherein the MR imaging device is configured to perform the method wherein the frequency of the occurrence of each motion state is determined based on a histogram which reflects the number of acquired MR signals per motion state.

17. The MR imaging device of claim 2, wherein the MR imaging device is configured to perform the method wherein a broader range of weighted factors is applied to the MR signals in the central portion of k-space, while less pronounced weighting is applied to the MR signals in the peripheral portion of k-space.

18. The MR imaging device of claim 2, wherein the MR imaging device is configured to perform the method wherein the weighting applied to the MR signals during reconstruction of the MR image is derived from a user-specified gating percentage.

19. The MR imaging device of claim 2, wherein the MR imaging device is configured to perform the method wherein the motion-induced displacements are breathing motion-induced displacements, and wherein each of the motion states is defined to correspond to one of a plurality of contiguous ranges of the breathing motion-induced displacements.

20. The MR imaging device of claim 2, wherein the MR imaging device is configured to perform the method wherein the object is a patient, and wherein MR signals acquired with the patient assuming their most frequently taken positions during breathing are given a stronger weight while MR signals acquired in rarely assumed positions are suppressed in the reconstructed MR image.

* * * * *